United States Patent
Sanchez et al.

(10) Patent No.: US 9,196,520 B1
(45) Date of Patent: Nov. 24, 2015

(54) TAPE RELEASE SYSTEMS AND METHODS FOR SEMICONDUCTOR DIES

(71) Applicant: Freescale Semiconductor, Inc., Austin, TX (US)

(72) Inventors: Audel A. Sanchez, Tempe, AZ (US); Michael L. Eleff, Phoenix, AZ (US); Jose L. Suarez, Chandler, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/449,148

(22) Filed: Aug. 1, 2014

(51) Int. Cl.
*H01L 23/52* (2006.01)
*H01L 21/683* (2006.01)

(52) U.S. Cl.
CPC ..... *H01L 21/6836* (2013.01); *H01L 2221/68327* (2013.01); *H01L 2221/68354* (2013.01); *H01L 2221/68381* (2013.01)

(58) Field of Classification Search
CPC .................................................. H01L 21/6836
USPC ........................................................ 257/783
See application file for complete search history.

(56) References Cited

U.S. PATENT DOCUMENTS

| | | | |
|---|---|---|---|
| 4,667,402 A | 5/1987 | Wilde | |
| 4,859,269 A | 8/1989 | Nishiguchi | |
| 6,106,222 A * | 8/2000 | Tsuji et al. | 414/811 |
| 6,582,223 B2 * | 6/2003 | Yasumura et al. | 432/258 |
| 6,869,264 B2 * | 3/2005 | Yoo | 414/416.09 |
| 6,889,427 B2 | 5/2005 | Yee et al. | |
| 7,632,374 B2 * | 12/2009 | Ozono et al. | 156/707 |
| 8,497,189 B1 * | 7/2013 | Hoshino | 438/463 |
| 8,691,666 B2 * | 4/2014 | Segawa et al. | 438/464 |

* cited by examiner

*Primary Examiner* — Luan C Thai
(74) *Attorney, Agent, or Firm* — Luiz von Paumgartten; Fogarty, L.L.C.

(57) ABSTRACT

Systems and methods for releasing semiconductor dies from an adhesive tape or film. In some embodiments, a semiconductor manufacturing device may include: a chuck plate configured to support an array of semiconductor dies, where each die in the array has a top surface and a bottom surface, where each die's bottom surface is bonded to an adhesive tape, and where the chuck plate comprises one or more channels configured to apply a negative pressure to the adhesive tape; and a tape release element having an irregular surface, the tape release element disposed between the chuck plate and the adhesive tape.

18 Claims, 3 Drawing Sheets

TAPE RELEASE SYSTEMS AND METHODS FOR SEMICONDUCTOR DIES

FIELD

This disclosure relates generally to semiconductors, and more specifically, to systems and methods for releasing semiconductor dies from an adhesive tape or film.

BACKGROUND

In semiconductor chip manufacturing, pre-packaging processes may include a variety of operations including, for example, semiconductor substrate mounting, wafer sawing, die separation, die transfer, die attach, and the like. These operations involve physically manipulating chips and therefore require the utmost care, as damaged chips increase processing costs and reduce yield. Incidentally, semiconductor technology continues to evolve in such a way that chip substrates have become more and more fragile (e.g., thinner), thus making chips incorporating those substrates more susceptible to fractures.

In a typical pre-packaging operation, after wafers are sorted, they are each mounted on an adhesive tape or film. The adhesive tape may provide support for the wafers during singulation, die transfer, or die attach operations. During the singulation operation, for example, a wafer saw or other cutting mechanism separates individual dies from the wafer while leaving them bonded onto the adhesive tape.

After singulation, a die attach operation or a sorting operation removes individual die from the adhesive tape or film and attaches them to a packaging substrate (e.g., a leadframe), or transfers them to another carrier for storage and later use. To that end, a conventional die bonder ejector system may include rod(s) or pin(s) configured to push each chip up and to separate it from the tape, thereby facilitating subsequent transport of the die by a pickup tool or the like. The inventors hereof have determined, however, that the use of ejector pins causes yet additional stresses on the dies, further increasing the risk of damage.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity and have not necessarily been drawn to scale.

DETAILED DESCRIPTION

Systems and methods for releasing semiconductor dies from an adhesive tape or film are described. At some point during the semiconductor manufacturing process, individual dies may need to be removed from an adhesive tape or film. Traditionally, this operation has been performed by a die bonder ejector system that includes rod(s) or pin(s) configured to push each chip up and to separate it from the tape. However, the use of ejector pins often damages the dies, which increases processing costs and reduces yield. Hence, to address this and other problems, the systems and methods for releasing semiconductor dies from an adhesive tape or film described herein employ a tape release element (e.g., a wire mesh, a machined chuck plate, etc.) having an irregular on uneven surface (e.g., peaks and valleys) configured to facilitate detachment or peeling of one or more dies from the adhesive tape.

As used herein, the term "semiconductor wafer" (or simply "wafer") refers to a slice of semiconductor material, such as a silicon crystal, for example, that may be used in the fabrication of integrated circuits (ICs) or other devices (e.g., microelectromechanical systems or "MEMs," nanoelectromechanical systems or "NEMs," etc.). The wafer serves as the substrate for the devices built upon it, and it may therefore be subject to various fabrication processes, such as, for instance, doping or ion implantation, etching, deposition, or photolithographic patterning. Once the ICs or devices are fabricated on the wafer, the individual dies are separated or diced as part of a singulation process, and then packaged in a casing or container.

During dicing, wafers are typically mounted on an adhesive tape or film, which has a sticky backing that holds the wafer on a frame. The adhesive tape or film may have different properties depending on the dicing application. For example, ultraviolet (UV) tapes may be used for smaller die sizes and non-UV tape may be used for larger die sizes. Once a wafer has been diced, the pieces left on the dicing tape are referred to as die, dice or dies. In many cases, the size of the dies left on the adhesive tape may range from approximately 35 mm to 0.1 mm square. And although each die may have any desirable shape, they are typically rectangular or square shaped.

As used herein, the term "die array" or "array of dies" refers to a plurality of dies bonded to adhesive tape of film, whether as a result of a wafer dicing operation or not. For example, in some cases, individual dies may be bonded to adhesive tape or film, after or independently of a wafer diving operation, to facilitate the subsequent storage or handling of those dies.

Figure 1:
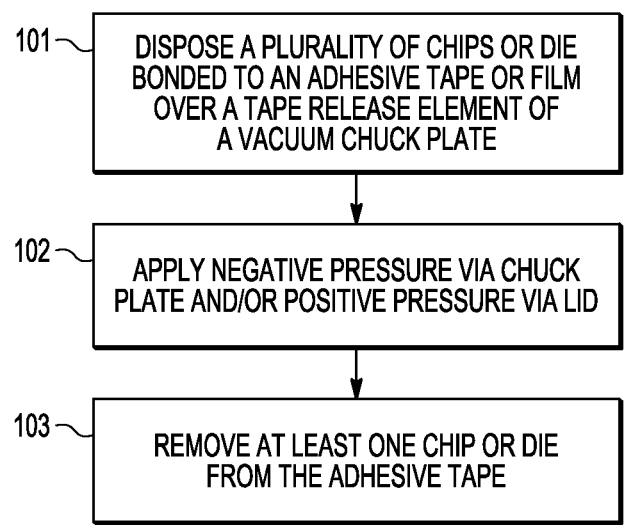
FIG. 1 is a flowchart of a method for releasing semiconductor dies from an adhesive tape or film, according to some embodiments.
Figure 2:
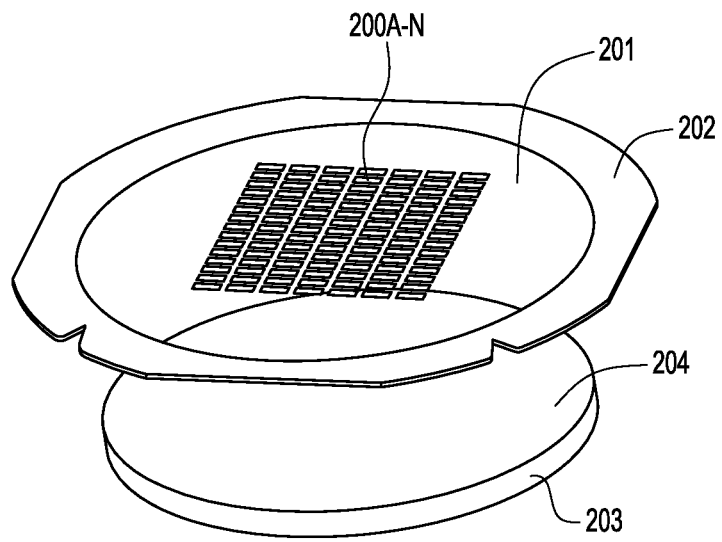
FIG. 2 is a perspective view of a semiconductor die array and chuck plate, according to some embodiments.
Figure 3:
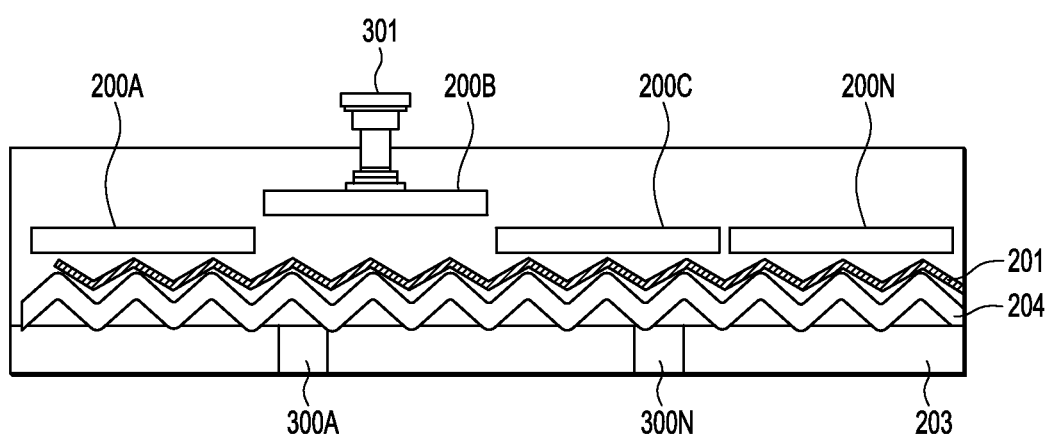
FIG. 3 is a cross-section view of an example of a tape release system, according to some embodiments.
Figure 5:
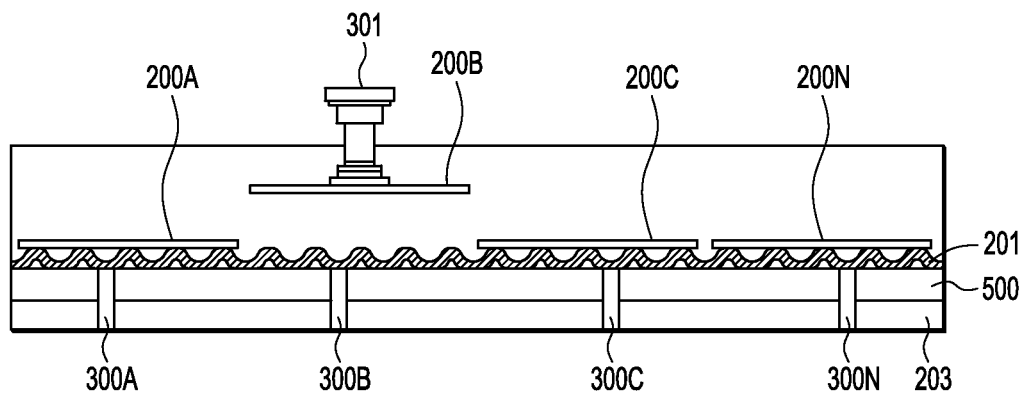
FIG. 5 is a cross-section view of another example of a tape release system, according to some embodiments.

FIG. 1 is a flowchart of a method for releasing semiconductor dies from an adhesive tape or film, according to some embodiments. At block 101, method 100 includes disposing a plurality of semiconductor chips, which are bonded to an adhesive tape or film, over a tape release element. The tape release element may be disposed on the surface of a vacuum chuck plate. As illustrated in FIGS. 2 and 3, the tape release element may include a wire mesh or the like. Additionally or alternatively, FIG. 5 illustrates a scenario where the tape release element may be a machined surface of the vacuum chuck plate (e.g., physical protrusions or the like). In contrast with conventional ejector pin(s) or rod(s), the tape release elements described herein may be characterized as "static" insofar as they do not physically move with respect to the dies during a tape release operation.

At block 102, method 100 includes applying a negative pressure via the vacuum chuck plate and/or a positive pressure via a lid or cup to the plurality of semiconductor chips and/or adhesive tape. By applying the negative and/or positive pressure(s), at least a portion of the adhesive tape may be made to conform to the uneven or irregular surface of the tape release element, thus at least partially detaching from the underside of the die(s). In some cases, heat may also be applied via the chuck plate to further facilitate the separation of the die(s) from the tape. In other words, the tape release element may provide die support and also a vacuum conduct that runs under the backside of the wafer/dies, such that the adhesive tape is peeled from the backside of the dies contained in the array by application of negative pressure to the bottom of the tape and/or by the application of positive pressure to the top of the tape, for instance, in connection with a pick and place operation. At block 103, method 100 may include removing at least one of the plurality of semiconductor chips from the at least partially peeled adhesive tape using a vacuum pick up tool or the like.

Method 100 may reduce the stress on dies and lower the risk of die crack during die pickup by eliminating the need for ejector pin to remove dies from the adhesive tape. As such, method 100 may be particularly important in the fabrication, handling, or backend assembly of very thin or fragile dies such as, for instance, dies with many Through-Silicon Vias (TSVs). It should be noted that, in various implementations of method 100, a conventional ejector is not needed and pins may not be needed.

To illustrate method 100, FIG. 2 presents a perspective view of a semiconductor die array and chuck plate according to some embodiments. Particularly, the die array includes a plurality of dies 200A-N bonded to adhesive tape 201. In this case the die array is arranged in a rectangular shape, and each of dies 200A-N is already singulated or otherwise separated from one another. Adhesive tape 201 is stretched or supported by frame 202, which may be a metal frame or the like. Vacuum chuck plate 203 is also shown, and it includes tape release element 204 disposed on or otherwise fabricated on its surface.

FIG. 3 is a cross-section view of an example of a tape release system according to some embodiments. Chuck plate 203 includes two or more vacuum lines or channels 300A-N, via which a negative pressure is applied to the underside of adhesive tape 201. The negative pressure causes tape 201 to conform to the shape of the surface of tape release element 204 and reduces physical contact between adhesive tape 201 and the bottom portion of each of the plurality of dies 200A-N. Once dies 200A-N are at least partially detached from tape 201, vacuum pickup tool 301 may lift each of dies 200A-N and transport them to another location to perform any suitable subsequent operation(s), for example, via a chip carrier or the like.

In various implementations, tape release element 204 may be configured with an irregular or uneven surface. For example, in some cases tape release element 204 may include a wire mesh or the like. Such a wire mesh may be made of a suitable material ranging from nylon to stainless steel, for example. In some cases, the geometric pattern provided by the wire mesh or may be configured specifically for a particular type of tape (e.g., the tape's tackiness, flexibility, etc.), a particular type of semiconductor array (e.g., number of chips, spacing between chips, size of each chip, etc.), or for a given type of applied pressure (e.g., negative and/or positive pressure, amount of pressure, etc.).

The irregular surface of tape release element 204 may include a pattern of peaks and valleys such that, when adhesive tape 201 conforms to the pattern due to the application of vacuum by chuck plate 203, it reduces the contact surface between adhesive tape 201 and dies 200A-N, therefore facilitating the complete removal of each of dies 200A-N by pickup tool 301. In some implementations, the reduction in contact surface between adhesive tape 201 and each of dies 200A-N due to the application of vacuum may be approximately 25%. In other implementations, the reduction may be approximately 50%. In yet other implementations, the reduction may be approximately 75%.

Additionally or alternatively, the peaks and valleys may be configured such that at least a predetermined number of peaks (e.g., three peaks) continue to make contact with any given chip—that is, the spacing between neighboring peaks may be directly proportional to the size or surface area of each chip in the array—and so that tape release element 204 may continue to support each individual chip after application of pressure.

Additionally or alternatively, chuck plate 203 may include a heating element configured to apply heat to adhesive tape in order to activate or soften the tape to facilitate peeling of the tape due to the vacuum application.

As will be understood by a person of ordinary skill in the art in light of this disclosure, vacuum pickup tool 301 is configured to pick up each individual one of the plurality of dies 200A-N without the use of an ejector pin.

Figure 4:
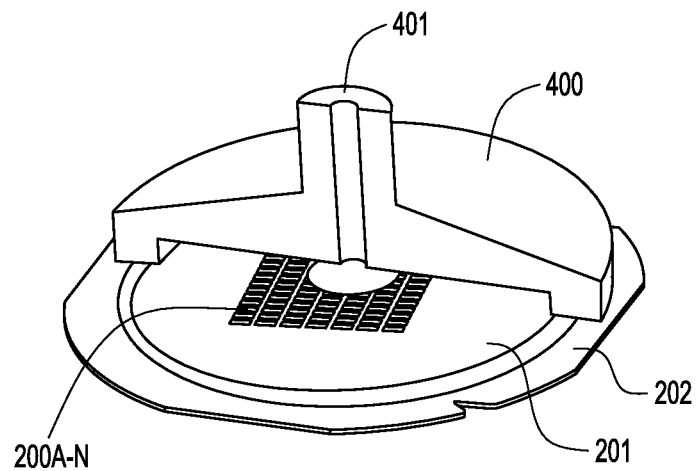
FIG. 4 is a perspective view of a semiconductor die array, chuck plate, and lid according to some embodiments.

FIG. 4 is a perspective view of a semiconductor die array, chuck plate, and lid according to some embodiments. As in FIG. 2, singulated dies 200A-N are bonded to adhesive tape 201, which is stretched or supported by frame 202. In addition to or as an alternative to a vacuum chuck plate, vacuum lid or cup 400 is provided to cover the array of semiconductor dies. Lid 400 includes one or more channels configured to apply a positive pressure upon adhesive tape 201 to aid in the peeling process. In some implementations, use of lid 400 may allow use of higher pressure levels inside the chamber formed between lid 400 and the chuck plate (not shown).

FIG. 5 is a cross-section view of another example of a tape release system, according to some embodiments. Similar to FIG. 3, here chuck plate 203 includes two or more vacuum lines 300A-N, via which a negative pressure is applied to the underside of adhesive tape 201, and that in turn causes tape 201 to conform to the shape of the surface of tape release element 500 to reduce the contact area between adhesive tape 201 and the bottom portion of each of the plurality of dies 200A-N. In contrast with FIG. 3, however, tape release element 500 is machined onto chuck plate 203 itself.

In some implementations, tape release element 500 may be provided in the form of a plurality of protrusions or holes fabricated on the surface of the chuck plate. In other implementations, chuck plate 203, tape release element 500 may be a detachable surface or plate coupled to the surface of chuck plate 203. In the latter case, tape release element 500 may include vacuum channels that match the channels of chuck plate 203, the bottom side of tape release element 500 may be flat, and the top side may include machined protrusions or holes. Generally speaking design considerations regarding the pattern of peaks and valleys of tape release element 500 are similar to those discussed in connection with FIG. 3.

As discussed above, in an illustrative, non-limiting embodiment, a semiconductor manufacturing device may include a chuck plate configured to support an array of semiconductor dies, where each die in the array has a top surface and a bottom surface, where each die's bottom surface is bonded to an adhesive tape, and where the chuck plate comprises one or more channels configured to apply a negative pressure to the adhesive tape; and a tape release element having an irregular surface, the tape release element disposed between the chuck plate and the adhesive tape.

In some cases, the array of semiconductor dies may include or otherwise be part of a semiconductor wafer. The tape release element may include a wire mesh. Additionally or alternatively, the tape release element may include a plurality of protrusions fabricated on a surface of the chuck plate. Moreover, the chuck plate may include a heating element configured to apply heat to the adhesive tape.

The irregular surface may include a plurality of peaks and valleys. The adhesive tape may be configured to, upon application of the negative pressure, conform to at least a portion of the peaks and valleys to reduce a contact surface between the adhesive tape and the array of semiconductor dies.

The semiconductor manufacturing may further include a vacuum pickup tool configured to pick up each individual one of the plurality of dies upon application of the negative pressure. The vacuum pickup tool may be configured to pick up each individual one of the plurality of dies without the use of an ejector pin. Additionally or alternatively, the semiconductor manufacturing device may further include a lid configured to cover the array of semiconductor dies and to apply a positive pressure to the adhesive tape.

In another illustrative, non-limiting embodiment, a method may include disposing a plurality of semiconductor chips over an uneven surface of a chuck plate, where the plurality of semiconductor chips are bonded to an adhesive tape; conforming at least a portion of the adhesive tape to the uneven surface by applying a pressure to the plurality of semiconductor chips; and removing at least one of the plurality of semiconductor chips from the adhesive tape.

In some cases, the uneven surface may include a wire mesh. Additionally or alternatively, the uneven surface may include a plurality of protrusions fabricated on a surface of the chuck plate.

The method may further include applying heat to the plurality of semiconductor chips prior to removing the at least one semiconductor chip. In some implementations, the pressure may include a negative pressure applied to an underside of the plurality of semiconductor chip via one or more vacuum lines of the chuck plate prior to removing the at least one semiconductor chip. Additionally or alternatively, the pressure may include a positive pressure applied to a top side of the plurality of semiconductor chip via one or more vacuum lines of a lid prior to removing the at least one semiconductor chip.

In yet another illustrative, non-limiting embodiment, a tape release system may include a chuck plate configured to support an array of semiconductor dies bonded to an adhesive tape and a static tape release element disposed between the chuck plate and the adhesive tape. The chuck plate may include one or more vacuum lines configured to apply a negative pressure to a bottom side of the adhesive tape. The tape release element comprises a wire mesh having a plurality of peaks and valleys and/or a plurality of protrusions fabricated on a surface of the chuck plate.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. A semiconductor manufacturing device, comprising:
   a chuck plate configured to support an array of semiconductor dies, wherein each die in the array has a top surface and a bottom surface, wherein each die's bottom surface is bonded to an adhesive tape, and wherein the chuck plate comprises one or more channels configured to apply a negative pressure to the adhesive tape;
   a tape release element having an irregular surface, the tape release element disposed between the chuck plate and the adhesive tape; and
   a lid configured to cover the array of semiconductor dies and to apply a positive pressure to the adhesive tape.

2. The semiconductor manufacturing device of claim 1, wherein the array of semiconductor dies comprises a semiconductor wafer.

3. The semiconductor manufacturing device of claim 1, wherein the tape release element comprises a wire mesh.

4. The semiconductor manufacturing device of claim 1, wherein the tape release element comprises a plurality of protrusions fabricated on a surface of the chuck plate.

5. The semiconductor manufacturing device of claim 1, wherein the chuck plate comprises a heating element configured to apply heat to the adhesive tape.

6. The semiconductor manufacturing device of claim 1, wherein the irregular surface comprises a plurality of peaks and valleys.

7. The semiconductor manufacturing device of claim 6, wherein the adhesive tape is configured to, upon application of the negative pressure, conform to at least a portion of the peaks and valleys to reduce a contact surface between the adhesive tape and the array of semiconductor dies.

8. The semiconductor manufacturing device of claim 1, further comprising a vacuum pickup tool configured to pick up each individual one of the plurality of dies upon application of the negative pressure.

9. The semiconductor manufacturing device of claim 1, wherein the vacuum pickup tool is configured to pick up each individual one of the plurality of dies without the use of an ejector pin.

10. A method, comprising:
    disposing a plurality of semiconductor chips over an uneven surface of a chuck plate, wherein the plurality of semiconductor chips are bonded to an adhesive tape;
    conforming at least a portion of the adhesive tape to the uneven surface by applying a pressure to the plurality of semiconductor chips; and
    removing at least one of the plurality of semiconductor chips from the adhesive tape, wherein the pressure comprises a positive pressure applied to a top side of the plurality of semiconductor chip via one or more vacuum lines of a lid prior to removing the at least one semiconductor chip.

11. The method of claim 10, wherein the uneven surface comprises a wire mesh.

12. The method of claim 10, wherein the uneven surface comprises a plurality of protrusions fabricated on a surface of the chuck plate.

13. The method of claim 10, further comprising applying heat to the plurality of semiconductor chips prior to removing the at least one semiconductor chip.

14. The method of claim 10, wherein the pressure comprises a negative pressure applied to an underside of the plurality of semiconductor chip via one or more vacuum lines of the chuck plate prior to removing the at least one semiconductor chip.

15. A tape release system, comprising:
   a chuck plate configured to support an array of semiconductor dies bonded to an adhesive tape;
   a static tape release element disposed between the chuck plate and the adhesive tape; and
   a lid configured to cover the array of semiconductor dies and to apply a pressure to the adhesive tape.

16. The tape release system of claim 15, wherein the chuck plate comprises one or more vacuum lines configured to apply a negative pressure to a bottom side of the adhesive tape.

17. The tape release system of claim 15, wherein the tape release element comprises a wire mesh having a plurality of peaks and valleys.

18. The tape release system of claim 15, wherein the tape release element comprises a plurality of protrusions fabricated on a surface of the chuck plate.

* * * * *